United States Patent [19]

Kobayashi et al.

[11] 4,027,728

[45] June 7, 1977

[54] VAPOR COOLING DEVICE FOR SEMICONDUCTOR DEVICE

[75] Inventors: Gai Kobayashi; Yoshiro Shikano; Masao Yano, all of Amagasaki, Japan

[73] Assignee: Mitsubishi Denki Kabushiki Kaisha, Tokyo, Japan

[22] Filed: Mar. 31, 1975

[21] Appl. No.: 563,354

[52] U.S. Cl. .............. 165/105; 174/15 R; 357/82; 336/58; 361/385

[51] Int. Cl.² ......................... H01L 23/42

[58] Field of Search ............ 165/105; 174/15 R; 317/100; 357/82; 336/58

[56] References Cited

UNITED STATES PATENTS

| | | | |
|---|---|---|---|
| 2,083,611 | 6/1937 | Marshall | 165/105 X |
| 2,561,738 | 7/1951 | Hill | 165/105 X |
| 2,711,882 | 6/1955 | Narbut | 165/105 X |
| 3,614,693 | 10/1971 | Frey | 165/105 X |
| 3,818,983 | 6/1974 | Grandia | 165/105 |
| 3,887,759 | 6/1975 | Staub et al. | 165/105 X |
| 3,906,261 | 9/1975 | Ogura et al. | 165/105 X |

*Primary Examiner*—Albert W. Davis, Jr.
*Attorney, Agent, or Firm*—Wenderoth, Lind & Ponack

[57] ABSTRACT

A semiconductor device is immersed into a cooling medium in its liquid phase disposed in a vessel. The cooling medium changes to its vapor phase due to heat from the semiconductor device to enter a condenser located above the vessel. The cooling medium condensed in the condenser passes through a conduit connected to the lower portion of the vessel to be directly mixed with the liquid cooling medium within the vessel.

2 Claims, 10 Drawing Figures

VAPOR COOLING DEVICE FOR SEMICONDUCTOR DEVICE

BACKGROUND OF THE DISCLOSURE

This invention relates to cooling device for vapor-cooling semiconductor devices and particularly power semiconductor rectifiers.

Vapor cooling systems utilizing the phase transition of the cooling medium and having an electrically insulating property and condensability at and adjacent room temperature are suitable for cooling high capacity semiconductor elements each capable of generating heat in an amount exceeding, for example, 1 kilowatt. This is because a very small temperature differential provides a thermal flux of high density. Under these circumstances, the heat generated by the semiconductor elements is required to be transported and dissipated to the exterior with a high efficiency because the semiconductor elements are small in size but handle large amounts of electric power. The best use of the characteristic features of the vapor cooling systems of the type referred to is made in connection with semiconductor elements for handling large amounts of power and more particularly with the planar types thereof. In general, planar semiconductor elements are arranged in a stack of alternate heat dissipation plates or blocks and semiconductor elements by means of a compressible contacting mechanism. Since this measure permits the resulting assembly to be small sized and economical, devices including the stack as above described are the object of the present invention.

If a stack having a plurality of planar semiconductor elements alternating in compressive contact relationship with heat dissipation blocks is horizontally disposed then the main heat dissipation surfaces of the blocks or elements lie in the vertical planes. This is important in view of the boiling and cooling operations for the following reasons: where there is a large amount of heat handled, the cooling operation can be continuously performed by upwardly moving bubbles of the particular cooling medium immediately after their formation on the heat dissipation surfaces and then contacting the liquid phase of the cooling medium.

The process as above described can be used with semiconductor elements of types other than the planar type because the resulting structure may include heat dissipation surfaces having vertical portions thereof with a suitable area to serve as the heat dissipation surfaces of the semiconductor elements and mounting plates therefor.

One or more of the stacks thus formed can be transversely disposed in accordance with the size of the resulting device thereby to immediately drive bubbles of a cooling medium generated on the heat dissipation portions into those portions located thereabove. In this case a plurality of stacks may be required to be put upon one another. In order to make the cooling effect uniform, it is desirable to limit the number of rows into which the stacks are disposed and vertically dispose the stacks at suitable intervals while each of the stacks is laterally displaced from the adjacent stack thereby to prevent the upward movement of the cooling medium from being impeded.

The vapor phase of the cooling medium should be condensed into the liquid phase through heat exchange between the same and the exterior, for example, the air after which the liquid phase thus formed again contributes to the cooling of the device.

It is important and also an object of the present invention that the cooling medium is caused to repeatedly pass through the boiling and condensing cycles with a high efficiency in order to provide large capacity devices.

Early systems for vapor cooling semiconductor devices have been based upon the concept that the vapor phase generated from the liquid cooling medium should be used to the condensing surface as rapidly as possible for more effective cooling. Thus vapor cooling devices have comprised the stack or stacks as above described immersed in an amount of a cooling medium charged into the lower portion of the vessel and the condensor means disposed in the upper portion of the same vessel or located above the vessel and in fluid communication with the latter. Such conventional cooling devices have encountered a common problem in that the flow of cooling medium in its vapor phase can not be certainly controlled so that temperature differentials occur on various portions of the condensing means with the result that it is difficult to operate the condensing means at its maximum efficiency.

SUMMARY OF THE INVENTION

Accordingly it is an object of the present invention to provide a new and improved cooling device for vapor-cooling a semiconductor device including a cooling system throughout at a uniform temperature and a condenser operative at a high efficiency by having the vapor phase of a cooling medium involved penetrating into the full volume thereof.

The present invention accomplishes this object by the provision of a vapor cooling device for vaporcooling a semiconductor device, comprising, a vessel, an amount of a cooling medium disposed in the vessel, the cooling medium having a liquid phase and a vapor phase for effecting a phase transition therebetween to cool a heat generation member, condenser means operatively connected to the vessel to condense the cooling medium into its vapor phase, and conduit means for communicating the vapor phase of the cooling medium formed within the vessel with the liquid phase of the cooling medium disposed in the vessel below the liquid level thereof, through the condenser means.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
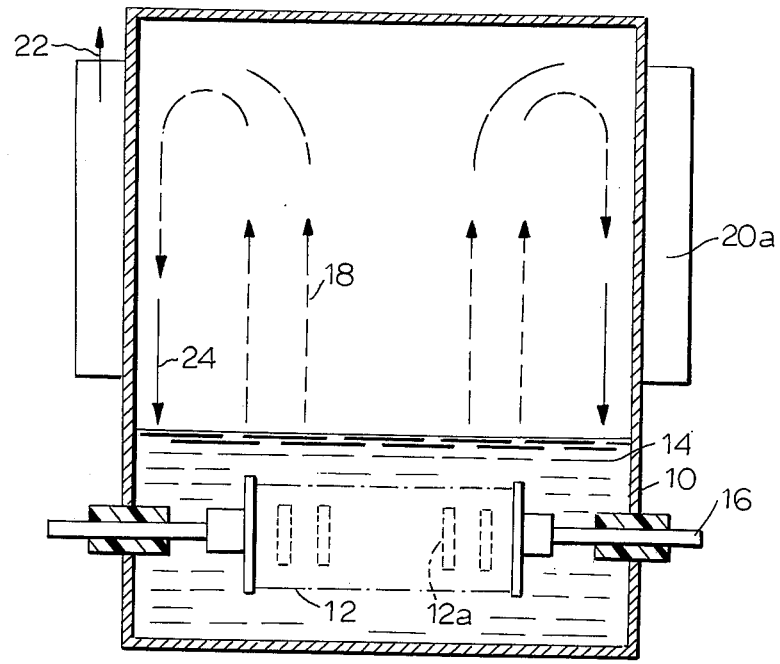
FIG. 1 is a longitudinal sectional view of a vapor cooling device constructed in accordance with the principles of the prior art with parts illustrated in elevation.
Figure 2:
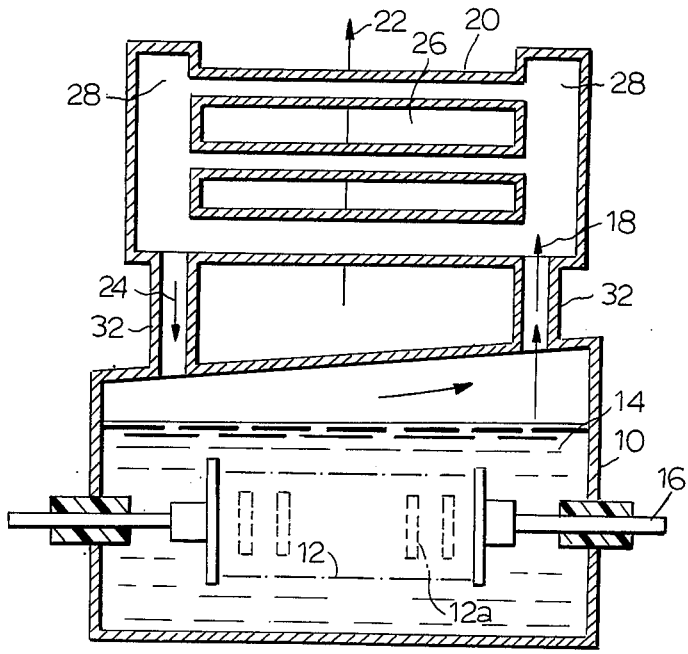
FIG. 2 is a view similar to FIG. 1 but illustrating another vapor cooling device of the conventional construction.
Figure 3:
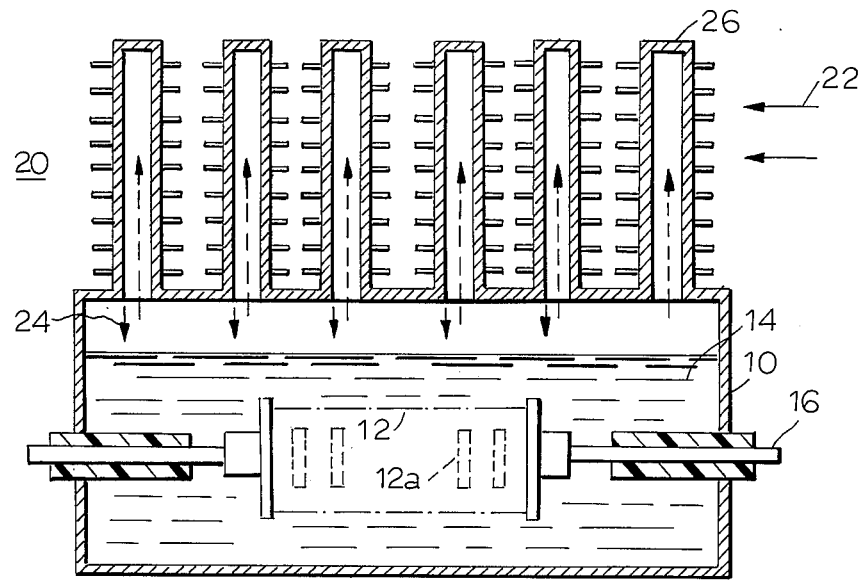
FIG. 3 is a view similar to FIG. 1 but illustrating still another vapor cooling device of the conventional construction.

Referring now to the drawings and FIGS. 1, 2 and 3 in particular, there are illustrated different vapor cooling devices constructed in accordance with the conceptions previously prevailing as above described. The arrangement shown in FIG. 1 comprises a vessel 10, a stack 12 of heat generation members such as high power planar semiconductor elements and alternating heat dissipation plates or blocks and an amount of a cooling medium in its liquid phase 14 charged into the lower portion of the vessel 10, although the heat generation members and heat dissipation plates or blocks are not illustrated only for purposes of keeping the drawing simple. The cooling medium in its liquid phase 14 has an electrically insulating property at and near room temperature and is boilable at a relatively low temperature to change it to its vapor phase. The cooling medium may be, for example, FREON (trade mark). The stack 12 is immersed in the cooling medium in its liquid phase 14 and maintained in place within the vessel 10 by having a pair of electrically insulated terminals 16 connected to the opposite sides thereof and extended and sealed through adjacent side walls of the vessel 10. The terminals 16 also serve to electrically connect the stack 12 to an external utilization device (not shown).

In operation the stack 12 generates heat to change the cooling medium from its liquid phase 14 to its vapor phase 18. The cooling medium in its vapor phase 18 rises to the upper portion of the vessel 10 as shown by the dashline arrows in FIG. 1.

As shown in FIG. 1, the vessel 10 is provided on the upper portion of the outer wall surface with a plurarity of vertical heat dissipation fins 20a. Air is directed past the fins 20a as shown by the arrow 22 for cooling purposes. Thus heat exchange is effected between the cooling air 22 and the cooling medium in its vapor phase 18 through the fins 20a and the side wall of the vessel 10 to condense the cooling medium into its liquid phase 14 on the upper portion of the inner wall surface of the vessel 10. The condensed cooling medium drops on the liquid cooling medium 14 along the inner wall surface thereof as shown by the arrows 24 in FIG. 1 to again take part in cooling the stack 12.

The arrangement of FIG. 1 is simple in construction but it is difficult to increase the area by which to dissipate heat to the exterior. Such an increase in area of heat dissipation is accompanied by an extreme increase in volume of the vessel 10 which has caused problems in high pressure vessels.

In order to increase the area of heat dissipation in small-sized vessels, it has been considered to form vessels into a structure such as shown in FIG. 2 wherein like reference numerals designate components identical to those shown in FIG. 1. The arrangement illustrated comprises vessel 10 including a tilted top wall and a condenser 20 disposed above the vessel 10. The vessel 10 has an amount of a cooling medium in its liquid phase 14 such as above described to leave a space above the liquid level thereof. The condenser 20 includes a plurality of finned cooling tubes 26 horizontally disposed in spaced parallel relationship, an influx header 28 connected in fluid communication with all the cooling tubes 26 at one end and an effux header 30 in fluid communication with all the cooling tubes 26 at the other ends. The influx header 28 is connected in fluid communication with the space within the vessel 10 through a vapor conduit 32 extending vertically from the tilted top wall of the vessel 10 on that end portion located at the higher level to the header 26. Similarly, the effux header 30 is connected in fluid communication with the space within the vessel 10 through a liquid conduit 34 extending vertically from the lower end portion of the top vessel wall to the header 30.

In other respects the arrangement is similar to that shown in FIG. 1.

In operation the vapor phase 18 of the cooling medium caused by heat generated by the stack 12 first fills the space above the liquid phase thereof and ascends through the vapor conduit 32 until it enters the influx header 28 as shown at the arrow 18 in FIG. 2. Then the cooling medium in its vapor phase 18 passes through the finned cooling tubes 26 while it is cooled by a stream of air 22 flowing past the tubes until the cooling medium is changed to its liquid phase and reaches the effux header 30 and then drops on the liquid cooling medium within the vessel 10 through the liquid conduit 34 as shown by the arrow 24 within the conduit 32 in FIG. 2.

The vessel 10 can have a volume reduced to such an extent that it is required only to accommodate the stack 12 and the cooling medium in its liquid phase 14. Also the use of a plurality of finned cooling tubes 26 can provide a large surface area required for the cooling medium to be cooled as compared with the total volume thereof. Furthermore, the top wall of the vessel 10 is somewhat tilted while the condenser 20 is disposed as close to the vessel 10 as possible. Further the condenser 20 is connected in fluid communication with the vessel 10 at a linearly broad sectional area. Therefore the cooling medium in its vapor phase 18 is adapted readily to enter the condenser 20.

If desired, the vessel 10 may have the top wall disposed substantially horizontal.

By advancing the conception of improvements in characteristics as above described in conjunction with FIG. 2, an arrangement as shown in FIG. 3 has been reached and is presently used for practical purposes. In FIG. 3 wherein like reference numerals designate components identical or similar to those shown in FIG. 1 or 2, a plurality of finned cooling tubes 26 closed at one end extend vertically from the horizontal top wall of the vessel 10 to form a condenser 20. In other respects the arrangement is substantially identical to that shown in FIG. 2.

Assuming that the stack 12 includes semiconductor elements as the heat dissipation members, the cooling medium changed from its liquid to its vapor phase due to the heating of the semiconductor elements rapidly ascends due to the difference in specific gravity between the two phases 14 and 18 until it enters the finned cooling tubes 26. Within the cooling tubes 26 heat is exchanged between the cooling medium in its vapor phase 18 and the air 22 flowing past the tubes to return the vapor phase 18 to the liquid phase 14. The cooling medium to be returned to its liquid phase 14 drops along the inner walls of the cooling tubes until it reaches the cooling medium in its liquid phase 14 within the vessel 10.

The arrangement of FIG. 3 has considerably improved the operating characteristics of the condenser and made it possible to put high capacity semiconductor devices to practical use.

As a result of studies, however, it has been found that the arrangements as shown in FIGS. 1 through 3, that is, the manner in which the cooling medium in its vapor phase is caused to enter the condenser in the easiest fashion is not always the best measure.

All the arrangements as above described have encountered a common problem in that the stream of the cooling medium in its vapor phase can not be certainly controlled with certainty so that different temperature differentials occur within the condenser. This has resulted in the condenser being difficult to operate at highest efficiency.

More specifically, the arrangement of FIG. 1 is disadvantageous in that the volume is large as previously described and, in addition, the cooling medium locally circulates in the upper portion of the vessel to decrease the temperature therein. This is because the cooling medium in its vapor phase 18 is diffused into the upper portion of the vessel in its entirety while the liquid phase thereof formed on the upper portion of the inner wall surface of the vessel is dispersed into a broad area to transfer heat to the vapor phase thereof as having ascended thereto. Therefore that decrease in temperature of the upper vessel portion is nothing but the deterioration of the characteristics of the condenser.

Also in the arrangement of FIG. 2 it is said that the cooling medium in its vapor phase 18 easily enters the condenser 20 through the vapor conduit 32. However, with a large quantity of heat generated by the stack 12, the vapor phase 18 violently ascends at every point in the liquid phase 14. At that time it is a matter of course that the vapor phase should tend to partly ascend through the liquid conduit 34 due to the resulting ascending speed thereof. Since the liquid phase 24 condensed in the efflux header 34 falls within the liquid conduit 34, the heat exchange is effected between the falling liquid phase and the ascending vapor phase within the liquid conduit 34. This has resulted in the phenomenon that the high temperature vapor phase from the vessel 10 does not sufficiently penetrate the condenser 20.

The phenomenon as above described can occur in the arrangement as shown in FIG. 3. In the arrangement of FIG. 3 the vapor phase 18 formed in the lower portion thereof can ascend to directly enter the cooling tubes 26 of the condenser 20 which is one of the great advantages. However, the liquid phase formed in each of the cooling tubes simultaneously falls along the inner wall surface thereof and therefore the heat exchange is effected between the falling liquid phase and the vapor phase at a high temperature ascending from the liquid cooling medium adjacent the inlet of each cooling tube. As a result, it becomes difficult for the hot vapor phase to penetrate fully into the upper portion of each cooling tube. Thus it is possible to cause a vertical temperature differential within each of the cooling tubes so that the tube is operated at less efficiency the further up the tube the efficiency is measured.

In order to eliminate the objection to the arrangement of FIG. 3 as above described double wall type cooling tubes have been previously proposed including the inner tubes having the vapor phase ascending therethrough and outer tubes having the liquid phase condensed from the vapor phase adjacent the upper end thereof and dropping therethrough. This has not resulted in a complete solution as will readily be understood from the structure itself.

The present invention contemplates to eliminate the disadvantages of and the objections to the prior art practice as above described by the provision of a cooling system operative at a uniform temperature as a whole and including condenser operative with a high efficiency by having the hot vapor phase of a cooling medium involved penetrating the entire portion thereof.

Figure 4:
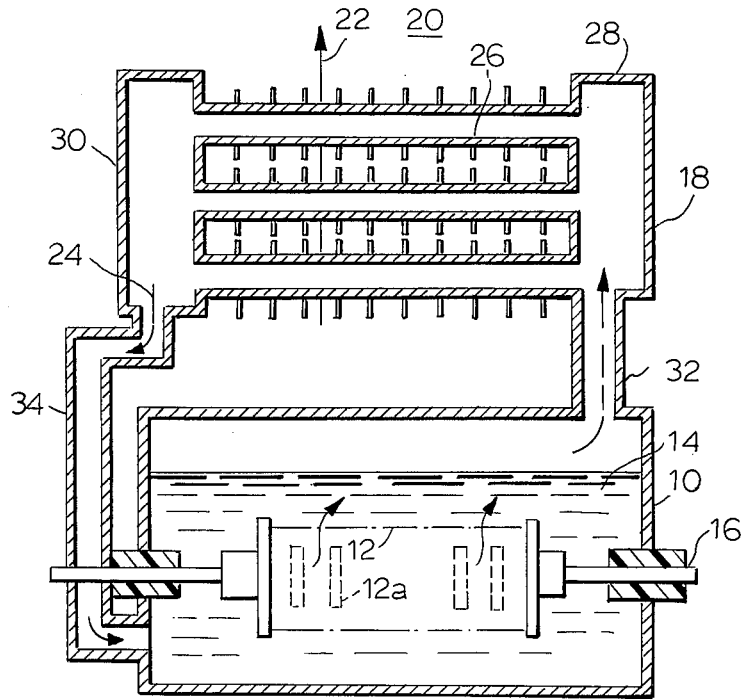
FIG. 4 is a longitudinal sectional view of a vapor cooling device constructed in accordance with the principles of the present invention.

Referring now to FIG. 4 wherein like reference numerals designate components identical or similar to those shown in FIG. 2, there is illustrated a vapor cooling device constructed in accordance with the principles of the present invention. The arrangement illustrated is substantially similar to that shown in FIG. 2 excepting that in FIG. 4 the liquid conduit 34 from the efflux header 36 is connected in fluid communication with the lower portion of that side wall of the vessel 10 located below the efflux header 28 so as to open into the liquid phase 14 of the cooling medium within the vessel with the vessel 10 having a horizontal top wall. That is, the cooling medium condensed into its liquid phase 24 is adapted to be mixed with the liquid cooling medium 14 within the vessel 10 at a point below the liquid level thereof.

Figure 5:
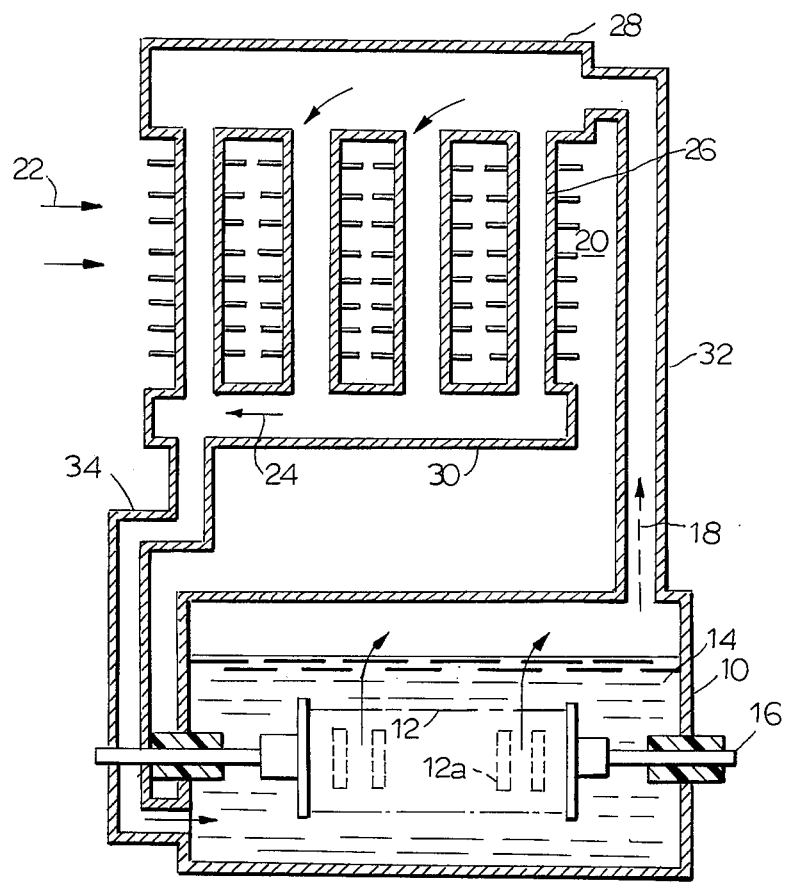
FIG. 5 is a view similar to FIG. 4 but illustrating a modification of the arrangement shown in FIG. 4.

FIG. 5 shows a modification of the arrangement as shown in FIG. 4 wherein the condenser 20 includes a plurality of finned cooling tubes 26 vertically disposed. In other respects the arrangement is identical to that shown in FIG. 4 and therefore like referrence numerals have been employed to identify the components identical to those shown in FIG. 4.

In vapor cooling devices with which the present invention is concerned, the vessel itself is prevented from being heated as in conventional boilers and therefore the boiling of the liquid cooling medium does not occur a the entire bottom surface of the vessel.

More specifically, heat generated by the heat generation elements or semiconductor elements is mostly dissipated from the peripheries of the heat dissipation members forming the stack with the heat generation elements. Thus no boiling occurs on the lower portion of the stack. In addition, the heat dissipation members and heat generation elements form vertical wall surfaces therebetween. Consequently the vapor phase of the cooling medium due to the heat from the heat generation elements is given a directional motion such that it is rapidly moved in the upward direction within the liquid cooling medium.

Under these circumstances, it is possible to cause those portions of the interior of the vessel spaced from the stack to be unexposed to the vapor phase even if the cooling medium violently boils. Since the vapor phase has extremely small specific gravity, it is rapidly reaised through the liquid phase from the peripheries of the heat dissipation members with a strong force. This force for driving the cooling medium in its vapor phase is attributable to the phase transition caused from the heat to be removed.

In the arrangement as shown in FIG. 4, the vapor phase of the cooling medium resulting from the heat generated by the heat dissipation members of the stack 12 fills the space left above the cooling medium in its liquid phase 14 within the vessel 10 and then ascends through the vapor conduit 32 to fill the influx header 28. This is because only the vapor conduit 32 connects that space to the header 28. The vapor phase from the header 28 uniformly flows into the parallel cooling tubes 26.

As the condenser 20 is at a very low vapor pressure at low temperatures, a temperature rise due to the boiling of the liquid cooling medium causes an increase in pressure which is, in turn, transmitted to the entire interior of the condenser 20 through the inflow of cooling medium in its vapor phase 18.

The cooling tubes 26 are connected in parallel to the efflux header 32 communicating with the liquid conduit 34 subsequently opening into that portion of the vessel 10 having no vapor phase of the cooling medium coming thereto even during boiling. That is, the liquid conduit 32 opens into the vessel 10 at a position not higher than that of the stack 12. Thus it is impossible for the cooling medium in its vapor phase 18 to enter the efflux header 30 through the liquid conduit 34.

A stream of air 22 cools the cooling tubes 26 to change the cooling medium filling them from its vapor to its liquid phase resulting in the dissipation of heat to the atmosphere. At that time the cooling medium is greatly reduced in volume and the influx header 28 continues to supply a large amount of the cooling medium in its vapor phase 18 from the vessel 10 to the cooling tubes 26 to compensate for the decrease in volume thereof while at the same time forcing the cooling medium changed to its liquid phase into the efflux header 30. Since the cooling medium in its vapor phase formed in the vessel 10 is not permitted to enter the efflux header 30 through the liquid conduit 32, the liquid cooling medium with a high density from the header 30 drops through the liquid conduit 34 without mixing with the vapor phase until it is returned to the vessel 10.

By providing the headers 28 and 30 at both ends of all the cooling tubes 26, the cooling medium in its vapor phase can be completely diffused into all the cooling tubes 26. The cooling medium changed to its liquid phase by condensation drops on the lowermost portion of the inner wall surface of each cooling tube and then it is driven into the efflux header 30 by the successive portions of the cooling medium in its vapor phase flowing into the respective cooling tube. Under these circumstance, the presence of the liquid cooling medium is limited only to one part of the lowermost portion of the inner wall of the tube and thus the liquid cooling medium continues to flow into the efflux header 30. Therefore it is possible to cause the condensation at almost all points in each of the cooling tubes 26.

Assuming that the cooling tubes have a circular cross section, drops of the liquid cooling medium formed in each cooling tube fall extremely rapidly on the lowermost portion of the inner tube wall in the cross sectional planes of each tube and therefore through minimum distances. This ensures that the drops of the liquid cooling medium falling from the upper part of the tube are prevented from covering the inner wall surface of each tube to decrease the efficiency of condensation.

In the arrangement of FIG. 4 it will be appreciated that the cooling medium carried by the heat generated within the vessel 10 rapidly ascends in the form of its vapor phase through the vapor conduit 32 due to a difference in specific gravity between the liquid and vapor phases until it enters the cooling tubes 26 disposed above the vessel 10 through the influx header 28. Within the cooling tubes 26 the cooling medium is condensed into its liquid phase after which it is returned to the cooling medium in its liquid phase 14 within the vessel 10 through the efflux header 30 and the liquid conduit 34. That is, the cooling medium spontaneously goes through the cyclic process having the boiling stage alternating with the condensing stage. Therefore a force for driving the cooling medium into that cyclic process can be spontaneously generated by the phase transition from the liquid to the vapor phase and vice versa without using any other auxiliary means. Also it is possible to increase the overall efficiency of heat transfer. The cyclic process also results from the simultaneous utilization of gravity as will readily be understood from the foregoing description made in conjunction with FIG. 4. Further the cyclic process can proceed at low temperatures, that is, with the cooling medium in its vapor phase having a subatmospheric pressure because it is formed independently of any external pressure.

Figure 6:
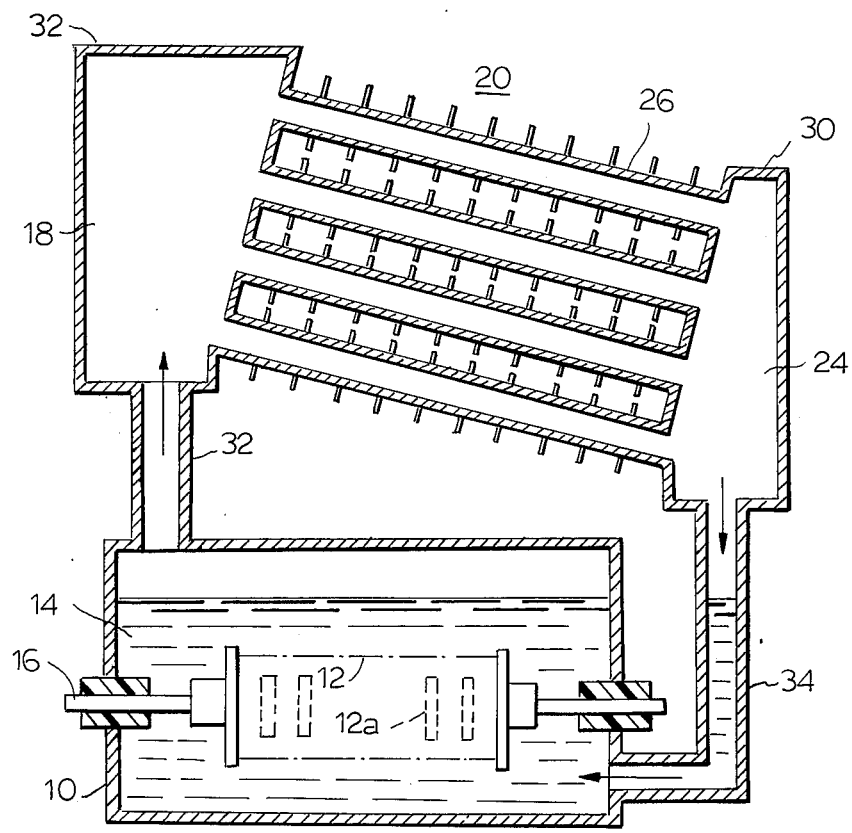
FIG. 6 is a schematic longitudinal sectional view of a modification of the present invention.

In FIG. 6 wherein like reference numerals designate components identical to those shown in FIG. 4, there is illustrated a modification of the present invention. In FIG. 6 the finned cooling tubes 26 are shown as being disposed at an inclination to the horizontal. In other respects, the arrangement is identical to that shown in FIG. 4. The inclined cooling tubes aid in moving the cooling medium condensed into liquid drops therein into the efflux header 30.

Figure 9:
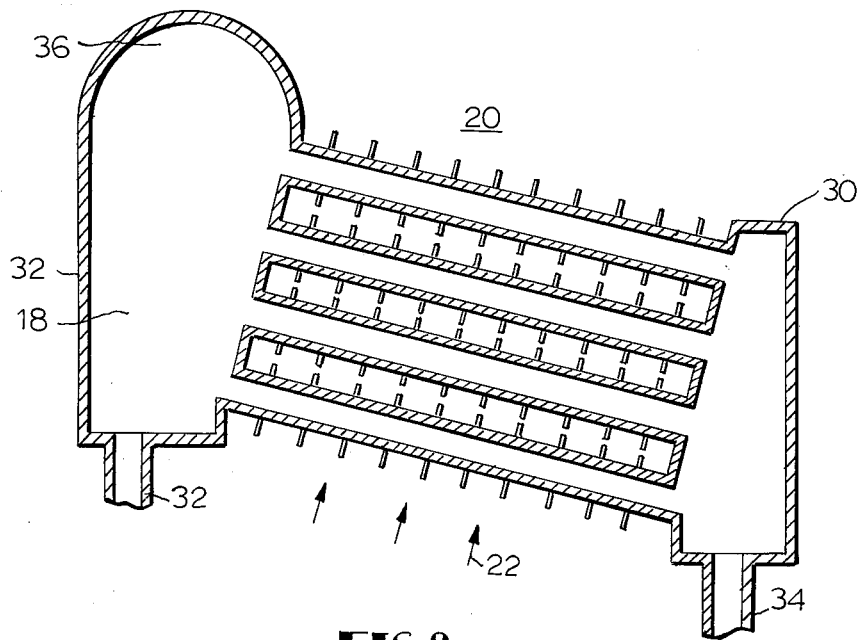
FIGS. 9 and 10 are a fragmental side elevational views illustrating different modifications of the arrangement shown in FIG. 7.
Figure 7:
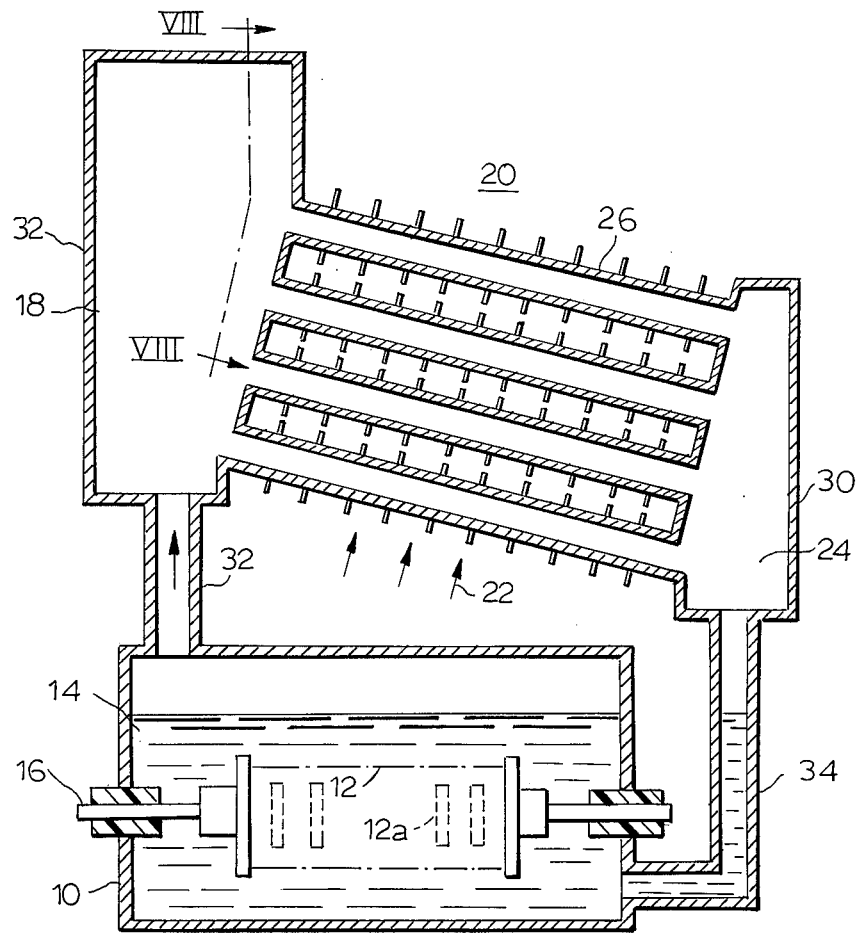
FIG. 7 is a side elevational view, partly in section of another modification of the present invention.
Figure 10:
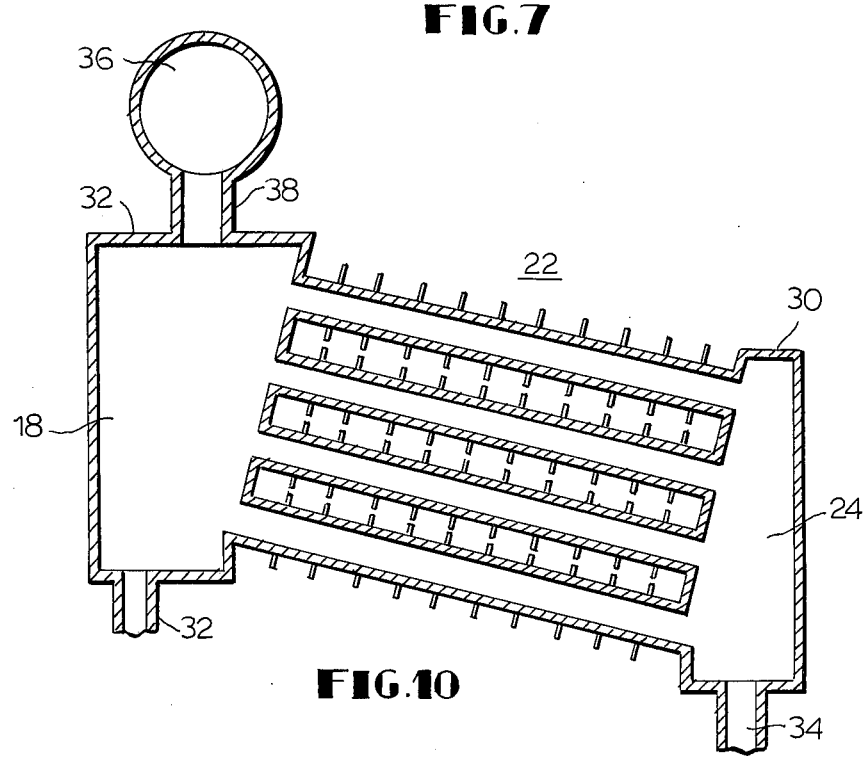

The arrangement of FIG. 6 can be variously modified as shown in FIGS. 7, 9 and 10 wherein like reference numerals designate components identical to those shown in FIG. 4.

Figure 8:
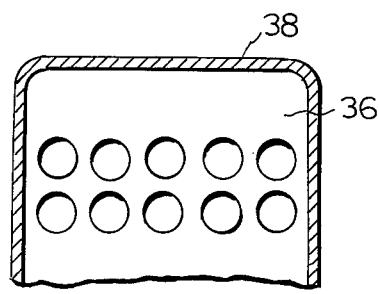
FIG. 8 is a fragmental sectional view taken along the line VIII—VIII of FIG. 7.

In FIG. 7 the influx header 28 positioned at a higher level includes an additional space 36 located above the uppermost ends of the cooling tubes 26 as best shown in FIG. 8.

In operation any external gas or gases that might enter the arrangement of FIG. 7 for any reason is or are forced to rise in the additional space 36 to occupy it.

By disposing the space 36 sufficiently higher in level than the group of the cooling tubes 26 such as shown in FIGS. 7 and 8, it is possible to keep the cooling tubes in normal operation even if any external gas or gases enter the arrangement without blocking their inlets for a flow of evaporated cooling medium with the external gas or gases. The volume of the additional space 36 can be determined by simultaneously estimating the leakage coefficient of the system and hours of continuous service. Therefore a good gas-tight property is not required unlike the conventional devices. This is directly reflected in the manufacturing cost. Thus the arrangement as shown in FIGS. 7 and 8 can provide a vapor cooling device which withstands leakage and is still inexpensive.

In FIG. 9 the additional space 34 is shown as being dome-shaped and in FIG. 10 is shown as being in the form of a hollow sphere connected to the efflux header 30 through a connecting tube 38. In other respects the arrangements shown in FIGS. 9 and 10 are identical to the arrangement illustrated in FIGS. 7 and 8.

From the foregoing it will be appreciated that the present invention provides a vapor cooling device permitting a hot vapor phase of a cooling medium to uniformly flow into any desired number of parallel cooling tubes, which the cooling tubes are externally and equally cooled. This is because the vapor phase of the cooling medium filling the cooling tubes originates from the boiling of the cooling medium within the vessel disposed below the cooling tubes and the inflow of the vapor phase thereof into the cooling tubes is accomplished by the formation of its liquid phase due to heat exchange caused by the external cooling of the cooling tubes. The present device prevents the unnecessary mixture of the liquid phase of the cooling medium formed through the condensation thereof with the vapor phase thereof ascending from the vessel.

While the present invention has been illustrated and described in conjunction with several preferred embodiments thereof it is to be understood that numerous changes and modifications may be resorted to without departing from the spirit and scope of the present invention. For example, a plurality of condensers 20 may be operatively connected in parallel to the vessel 10. Also the stack 12 including the semiconductor elements may be disposed externally of the vessel 10 and be cooled through the phase transition of the particular cooling medium via a side or a bottom wall thereof.

What we claim is:

1. A cooling device for cooling a heat generating semiconductor device comprising a vessel, an amount of a cooling medium disposed in said vessel, said cooling medium having a liquid phase and a vapor phase and effecting a phase transition therebetween to cool a heat generating member, condenser means operatively connected to said vessel to condense said cooling medium from its vapor phase into its liquid phase and including a pair of spaced opposed headers having a substantial vertical dimension in the vertical cross-section thereof, a plurality of cooling tubes connected in parallel between said headers, one of said headers being an inlet header and being connected to said vessel to receive vapor therefrom and having a space therein at a level higher than the openings into said cooling tubes for collection of any gas entrained in said device, and conduit means connecting the other header to said vessel below the liquid level of the cooling medium in said vessel.

2. A cooling device as claimed in claim 1 wherein said plurality of cooling tubes is inclined downwardly from said inlet header to said other header.

* * * * *